United States Patent
Wong

(10) Patent No.: US 6,839,551 B1
(45) Date of Patent: Jan. 4, 2005

(54) RADIO FREQUENCY MIXER AND METHOD OF OPERATION

(75) Inventor: Hee Wong, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 592 days.

(21) Appl. No.: 09/862,048

(22) Filed: May 21, 2001

(51) Int. Cl.$^7$ .............................. H04B 1/26; H04B 15/00
(52) U.S. Cl. ........................ 455/314; 455/293; 455/316; 455/326; 455/337; 375/324
(58) Field of Search .................. 455/210–211, 263, 455/276.1, 284, 293, 295–296, 304, 309–314, 316–318, 323–324, 326, 337; 375/324, 330

(56) References Cited

U.S. PATENT DOCUMENTS

| | | | | |
|---|---|---|---|---|
| 5,179,728 A | * | 1/1993 | Sowadski ................ | 455/183.1 |
| 5,548,831 A | * | 8/1996 | Bijker et al. .............. | 455/207 |
| 5,809,409 A | * | 9/1998 | Itoh et al. ................ | 455/327 |
| 5,862,466 A | * | 1/1999 | Erickson .................. | 455/321 |
| 6,449,471 B1 | * | 9/2002 | Katsura et al. .......... | 455/324 |
| 6,473,606 B1 | * | 10/2002 | Ecklund et al. .......... | 455/314 |
| 6,683,919 B1 | * | 1/2004 | Olgaard et al. .......... | 375/316 |
| 6,693,980 B1 | * | 2/2004 | Linder et al. ............ | 375/329 |

* cited by examiner

Primary Examiner—Simon Nguyen

(57) ABSTRACT

There is disclosed a radio frequency (RF) demodulation circuit comprising: 1) a first RF mixer having a first input port for receiving an in-phase RF signal having a frequency of RF and a second input port for receiving an in-phase local oscillator (LO) signal having a frequency of LO, wherein LO is approximately equal to one-half of RF, and wherein the first RF mixer generates a first intermediate frequency (IF) signal having a frequency of LO; 2) a second RF mixer having a first input port for receiving an out-of-phase RF signal having a frequency of RF and a second input port for receiving an out-of-phase local oscillator (LO) signal having a frequency of LO, and wherein the second RF mixer generates a second intermediate frequency (IF) signal having a frequency of LO; and 3) a first signal combiner for combining the first and second IF signals to generate a composite IF signal, wherein the first signal combiner combines a first leakage signal from the first RF mixer and a second leakage signal from the second RF mixer such that the first and second leakage signals at least partially cancel each other to produce an output leakage signal that is less than either of the first and second leakage signals.

22 Claims, 2 Drawing Sheets

RADIO FREQUENCY MIXER AND METHOD OF OPERATION

TECHNICAL FIELD OF THE INVENTION

The present invention is generally directed to radio frequency (RF) receivers and, in particular, to a zero image RF mixer optimized for use in a single chip radio receiver.

BACKGROUND OF THE INVENTION

Business and consumers use a wide array of wireless devices, including cell phones, wireless local area network (LAN) cards, global positioning system (GPS) devices, electronic organizers equipped with wireless modems, and the like. The increased demand for wireless communication devices has created a corresponding demand for technical improvements to such devices. Generally speaking, more and more of the components of conventional radio receivers and transmitters are being fabricated in a single integrated circuit (IC) package. In order to simplify single chip designs and to make each design suitable for as many applications as possible, much emphasis has been placed on developing direct conversion receivers and so-called "software-defined" radios.

Generally, the demodulation in these radios requires a single multiplication step to recover the transmitted baseband information. A mixer functions as the demodulator. However, a physical mixer also introduces signal leakages among its signal ports (RF input, LO input, and IF output). The signal leakages develop DC-offset levels that change dynamically when the operating environment of the receiver changes. As a result of these impairments, demodulation errors occur.

Many RF receiver designs implement control loops to track and compensate for the unwanted offset disturbances. However, many of these control loops are difficult and expensive to implement in a single integrated circuit package. Many designs require complicated image-rejection filters.

Therefore, there is a need in the art for improved RF receivers that are low cost, high performance and easily integrated into a single integrated circuit chip. In particular there is a need for a RF mixer that minimizes the amount of signal leakage introduced at the RF input port, the local oscillator input port and the intermediated frequency (IF) output port.

SUMMARY OF THE INVENTION

To address the above-discussed deficiencies of the prior art, it is a primary object of the present invention to provide an improved RF demodulation circuit that uses a two step mixing process to combat the impairments described above. The present invention has a simple architecture, but offers high level performance at low cost. No complicated image-rejection filters are required. Thus, an RF mixer according to the principles of the invention is an ideal solution for manufacturing high volume radio frequency (RF) receivers on a single integrated circuit.

According to an advantageous embodiment of the present invention, there is provided a radio frequency (RF) demodulation circuit comprising: 1) a first RF mixer having a first input port capable of receiving an in-phase RF signal having a frequency of RF and a second input port capable of receiving an in-phase local oscillator (LO) signal having a frequency of LO, wherein LO is approximately equal to one-half of RF, and wherein the first RF mixer generates a first intermediate frequency (IF) signal having a frequency of LO; 2) a second RF mixer having a first input port capable of receiving an out-of-phase RF signal having a frequency of RF and a second input port capable of receiving an out-of-phase local oscillator (LO) signal having a frequency of LO, and wherein the second RF mixer generates a second intermediate frequency (IF) signal having a frequency of LO; and 3) a first signal combiner capable of combining the first and second IF signals to generate a composite IF signal, wherein the first signal combiner combines a first leakage signal from the first RF mixer and a second leakage signal from the second RF mixer such that the first and second leakage signals at least partially cancel each other to produce an output leakage signal that is less than either of the first and second leakage signals.

According to one embodiment of the present invention, the radio frequency demodulation circuit further comprising a first transformer having an input winding capable of receiving an incoming RF signal and an output winding capable of generating the in-phase RF signal and the out-of-phase RF signal.

According to another embodiment of the present invention, the radio frequency demodulation circuit further comprises a local oscillator capable of generating a reference local oscillator signal having the frequency of LO.

According to still another embodiment of the present invention, the radio frequency demodulation circuit further comprises a second transformer having an input winding capable of receiving the reference local oscillator signal and an output winding capable of generating the in-phase LO signal and the out-of-phase LO signal.

According to yet another embodiment of the present invention, the radio frequency demodulation circuit further comprises a bandpass filter having an input coupled to an output of the first signal combiner capable of receiving the composite IF signal and an output capable of outputting a filtered composite IF signal.

According to a further embodiment of the present invention, the bandpass filter has a low Q-value at the frequency of LO.

According to a still further embodiment of the present invention, the radio frequency demodulation circuit further comprises an IF mixer having a first input port capable of receiving the filtered composite IF signal having the frequency of LO and a second input port capable of receiving the reference local oscillator signal.

According to a yet further embodiment of the present invention, the IF mixer down-converts the filtered composite IF signal to thereby generate a first baseband signal.

In one embodiment of the present invention, the radio frequency demodulation circuit further comprises a second signal combiner capable of combining the first baseband signal and a DC cancellation signal to thereby generate a second baseband signal.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

Figure 1:
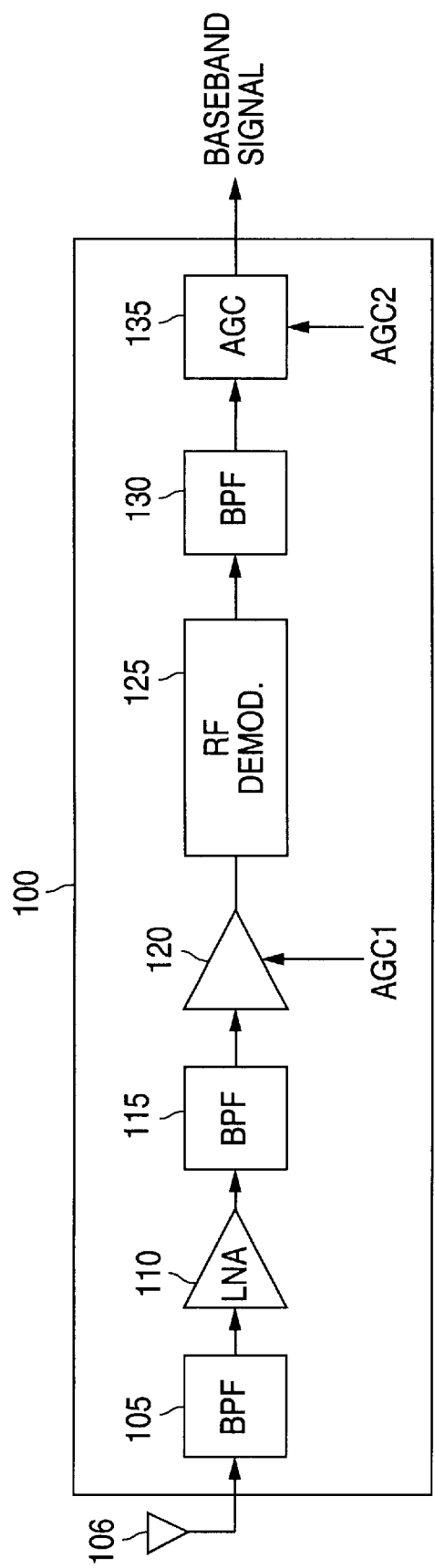
FIG. 1 illustrates selected portions of the receive signal path of an exemplary RF transceiver according to one embodiment of the present invention.
Figure 2:
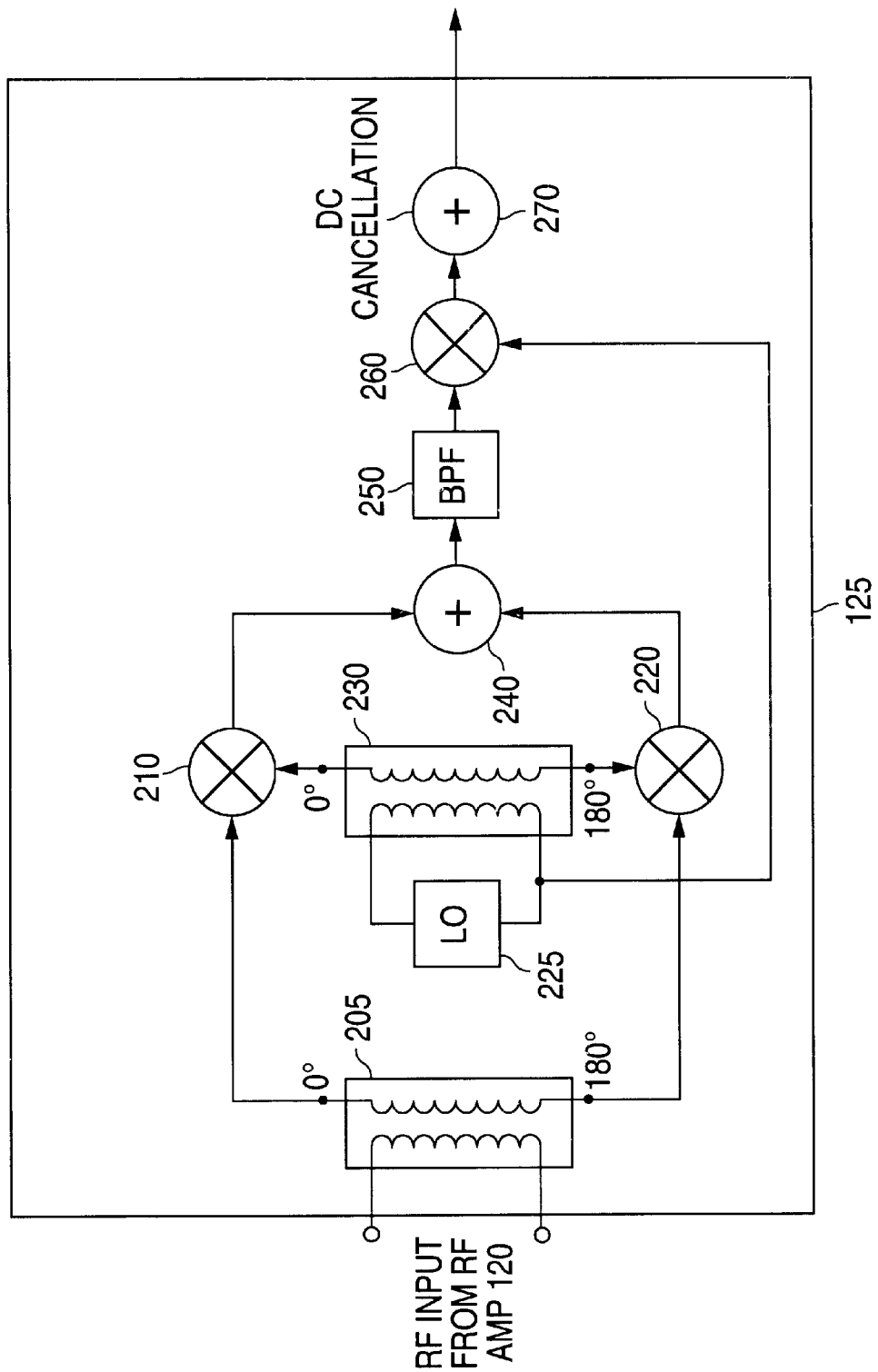
FIG. 2 illustrates selected portions of an improved radio frequency demodulator in the exemplary RF transceiver in FIG. 1 according to one embodiment of the present invention.

FIGS. 1 and 2, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged radio frequency (RF) receiver.

FIG. 1 illustrates selected portions of the receive signal path of exemplary RF receiver 100 according to one embodiment of the present invention. RF receiver 100 may be implemented in any conventional one-way or two-way RF communication device, including a cell phone, a wireless network card, a two-way pager, and the like. For the purpose of simplifying the explanation of the present invention, the transmitter portion of a two-way communication embodiment of the present invention is not shown.

The RF receive path through RF receiver 100 comprises band pass filter (BPF) 105, which receives an incoming RF signal from antenna 106. The RF receive path further comprises low-noise amplifier (LNA) 110, band pass filter (BPF) 115, RF amplifier 120, RF demodulator 125, band pass filter (BPF) 130, and automatic gain control (AGC) circuit 135.

BPF 105 isolates the frequencies of interest in the incoming RF signal from antenna 106 and filters out unwanted frequency bands. LNA 110 amplifies the filtered output of BPF 105 to an intermediate level. BPF 115 further filters the amplified output of LNA 110 to remove noise outside of the desired receiver frequency range that were amplified by, or introduced by, LNA 110. RF amplifier 120 further amplifies the output of BPF 115 by a variable amount of gain determined by the gain control signal AGC1. RF demodulator 125 down-converts the output of RF amplifier 120 by mixing it with a local oscillator reference signal. RF demodulator 125 effectively shifts the information signal centered around the receiver RF operating frequency down to a baseband signal.

At this point, the signal output by RF demodulator 125 may have spurious signals outside of the desired frequency range of the information signal which have been amplified and/or introduced by the RF demodulator 125. BPF 130 is an extremely narrow filter that blocks all but the desired frequencies of interest from reaching AGC 135. AGC circuit 135 further amplifies the filtered output of BPF 130 by a variable amount of gain determined by the gain control signal AGC2.

Those skilled in the art will recognize that, in alternate embodiments of the present invention, one or more of BPF 105, BPF 115, and BPF 130 may be other types of filters, including low pass filters. In particular, BPF 130 may be a low pass filter in an alternate embodiment. The choice of bandpass filters in the exemplary embodiment described above is by way illustration only and should not be construed so as to limit the scope of the present invention.

FIG. 2 illustrates selected portions of radio frequency demodulator 125 in exemplary RF receiver 100 according to one embodiment of the present invention. RF demodulator 125 comprises transformer 205, RF mixers 210, RF mixer 220, local oscillator (LO) 225, transformer 230, signal combiner 240, bandpass filter 250, IF mixer 260, and signal combiner 270. Transformer 205 receives on its primary windings an RF input signal from the output of RF amplifier 120. On its output windings, RF transformer 205 generates a 0° phase shifted RF output signal (i.e., in-phase RF output) on a first output terminal and a 180° phase shifted RF output signal (i.e., out-of-phase RF output) on a second output terminal. The in-phase RF output signal is applied to a first input port of RF mixer 210. The out-of-phase RF output signal is applied to a first input port of RF mixer 220.

Local oscillator (LO) 225 generates a LO reference signal at one half the frequency of the RF input signal received by transformer 205. For instance, if the operating frequency of RF receiver 100 is 2.4 gigahertz (GHz), the RF input signal on the primary windings of transformer 205 is also at 2.4 GHz and LO 225 and generates a LO reference signal at 1.2 Ghz. The LO reference signal is applied to the primary windings of RF transformer 230. On its output windings, RF transformer 230 generates a 0° phase shifted LO output signal (i.e., in-phase LO output) on a first output terminal and a 180° phase shifted LO output signal (i.e., out-of-phase LO output) on a second output terminal. The in-phase LO output signal is applied to a second input port of RF mixer 210. The out-of-phase LO output signal is applied to a second input port of RF mixer 220.

RF mixer 210 produces an intermediate frequency output signal at RF−LO=IF. Since LO=(RF)/2, the IF frequency also equals (RF)/2. In the example given above, where RF=2.4 GHz and LO=1.2 GHz, the IF frequency equals 1.2 Ghz. Similarly, RF mixer 220 produces an intermediate frequency output signal at RF−LO=IF. Since RF mixer 210 receives the in-phase RF input signal and the in-phase LO input signal and RF mixer 220 receives the out-of-phase RF input signal and the out-of-phase LO input signal, the IF output signal from RF mixer 210 and the IF output signal from RF mixer 220 are in phase with each other. However, the leakage signals in the IF output signals from RF mixer 210 and RF mixer 220 caused by the in-phase and out-of-phase LO reference signals are not in phase with each other.

Because the IF output signal from RF mixer 210 and the IF output signal from RF mixer 220 are in phase with each other, signal combiner 240 adds the two IF output signals together to produce a larger composite IF output signal. However, since the leakage signals in the IF outputs from RF mixer 210 and RF mixer 220 are out of phase with each other, signal combiner 240 subtracts the two leakage signals to effectively cancel the leakage signals in the composite IF output signal on the output of signal combiner 240.

BPF 250 filters the composite IF output signal from signal combiner 240 to isolated the frequencies of interest at the LO frequency (e.g., 1.2 Ghz). BPF 250 has a low Q value at the LO frequency. The filtered composite IF output signal is applied to a first input port of IF mixer 260. The 180° phase shifted LO output signal (i.e., out-of-phase LO output) from LO 225 is applied to the second input port of IF mixer 260. It should be noted that there is no requirement that the 180° phase shifted LO output signal from LO 225 be used. In an alternative embodiment of the present invention, the 0° phase shifted LO output signal (i.e., the in-phase LO output) from LO 225 may be used by IF mixer 260.

IF mixer 260 produces an image signal at IF-LO. Since IF=LO, the output of IF mixer 260 is only the baseband signal with a small DC component. Signal combiner 270 receives the baseband signal on a first input port and a DC CANCELLATION signal on a second input port. The DC CANCELLATION signal effectively cancels the small DC component in the baseband signal. The control circuitry for generating the DC CANCELLATION signal is not shown for purposes of simplicity. Any convention DC cancellation feedback control loop is suitable for this purpose.

Furthermore, it should be noted that there is no requirement that transformers be used to produce the in-phase RF output signal, the out-of-phase RF output signal, the in-phase LO output signal, and the out-of-phase LO output signal. Transformers 205 and 230 were selected for the purpose of illustration only. In alternate embodiments of the present invention, other types of circuits, including differential amplifiers, may be used to produce 0° phase shifted RF and LO output signals and 180° phase shifted RF and LO output signals.

An RF demodulation circuit according to the principles of the present invention provides very good spurious noise and image rejection. It also is inexpensive to fabricate and is therefore very suitable for single-chip radio devices. Because the local oscillator runs at one-half the frequency of the RF frequency, an RF demodulation circuit according to the principles of the present invention is a relatively low power device. It also has low local oscillator-to-antenna leakage.

Although the present invention has been described in detail, those skilled in the art should understand that they can make various changes, substitutions and alterations herein without departing from the spirit and scope of the invention in its broadest form.

What is claimed is:

1. A radio frequency (RF) demodulation circuit comprising:

a first RF mixer having a first input port capable of receiving an in-phase RF signal having a frequency of RF and a second input port capable of receiving an in-phase local oscillator (LO) signal having a frequency of LO, wherein LO is approximately equal to one-half of RF, and wherein said first RF mixer generates a first intermediate frequency (IF) signal having a frequency of LO;

a second RF mixer having a first input port capable of receiving an out-of-phase RF signal having a frequency of RF and a second input port capable of receiving an out-of-phase local oscillator (LO) signal having a frequency of LO, and wherein said second RF mixer generates a second intermediate frequency (IF) signal having a frequency of LO; and a first signal combiner capable of combining said first and second IF signals to generate a composite IF signal, wherein said first signal combiner combines a first leakage signal from said first RF mixer and a second leakage signal from said second RF mixer such that said first and second leakage signals at least partially cancel each other to produce an output leakage signal that is less than either of said first and second leakage signals.

2. The radio frequency demodulation circuit as set forth in claim 1 further comprising a first transformer having an input winding capable of receiving an incoming RF signal and an output winding capable of generating said in-phase RF signal and said out-of-phase RF signal.

3. The radio frequency demodulation circuit as set forth in claim 1 further comprising a local oscillator capable of generating a reference local oscillator signal having said frequency of LO.

4. The radio frequency demodulation circuit as set forth in claim 3 further comprising a second transformer having an input winding capable of receiving said reference local oscillator signal and an output winding capable of generating said in-phase LO signal and said out-of-phase LO signal.

5. The radio frequency demodulation circuit as set forth in claim 4 further comprising a bandpass filter having an input coupled to an output of said first signal combiner and capable of receiving said composite IF signal and an output capable of outputting a filtered composite IF signal.

6. The radio frequency demodulation circuit as set forth in claim 5 wherein said bandpass filter has a low Q-value at said frequency of LO.

7. The radio frequency demodulation circuit as set forth in claim 5 further comprising an IF mixer having a first input port capable of receiving said filtered composite IF signal having said frequency of LO and a second input port capable of receiving said reference local oscillator signal.

8. The radio frequency demodulation circuit as set forth in claim 7 wherein said IF mixer down-converts said filtered composite IF signal to thereby generate a first baseband signal.

9. The radio frequency demodulation circuit as set forth in claim 8 further comprising a second signal combiner capable of combining said first baseband signal and a DC cancellation signal to thereby generate a second baseband signal.

10. A radio frequency (RF) receiver comprising:

a receiver front-end circuit capable of receiving an incoming RF signal from an antenna and filtering and amplifying said incoming RF signal; and a radio frequency (RF) demodulation circuit comprising:
a first RF mixer having a first input port capable of receiving an in-phase RF signal having a frequency of RF and a second input port capable of receiving an in-phase local oscillator (LO) signal having a frequency of LO, wherein LO is approximately equal to one-half of RF, and wherein said first RF mixer generates a first intermediate frequency (IF) signal having a frequency of LO;
a second RF mixer having a first input port capable of receiving an out-of-phase RF signal having a frequency of RF and a second input port capable of receiving an out-of-phase local oscillator (LO) signal having a frequency of LO, and wherein said second RF mixer generates a second intermediate frequency (IF) signal having a frequency of LO; and
a first signal combiner capable of combining said first and second IF signals to generate a composite IF signal, wherein said first signal combiner combines a first leakage signal from said first RF mixer and a second leakage signal from said second RF mixer such that said first and second leakage signals at least partially cancel each other to produce an output leakage signal that is less than either of said first and second leakage signals.

11. The radio frequency receiver as set forth in claim 10 further comprising a first transformer having an input winding capable of receiving said filtered and amplified incoming RF signal and an output winding capable of generating said in-phase RF signal and said out-of-phase RF signal.

12. The radio frequency receiver as set forth in claim 10 further comprising a local oscillator capable of generating a reference local oscillator signal having said frequency of LO.

13. The radio frequency receiver as set forth in claim 12 further comprising a second transformer having an input winding capable of receiving said reference local oscillator signal and an output winding capable of generating said in-phase LO signal and said out-of-phase LO signal.

14. The radio frequency receiver as set forth in claim 13 further comprising a bandpass filter having an input coupled to an output of said first signal combiner and capable of receiving said composite IF signal and an output capable of outputting a filtered composite IF signal.

15. The radio frequency receiver as set forth in claim 14 wherein said bandpass filter has a low Q-value at said frequency of LO.

16. The radio frequency receiver as set forth in claim 14 further comprising an IF mixer having a first input port capable of receiving said filtered composite IF signal having said frequency of LO and a second input port capable of receiving said reference local oscillator signal.

17. The radio frequency receiver as set forth in claim 16 wherein said IF mixer down-converts said filtered composite IF signal to thereby generate a first baseband signal.

18. The radio frequency receiver as set forth in claim 17 further comprising a second signal combiner capable of combining said first baseband signal and a DC cancellation signal to thereby generate a second baseband signal.

19. A method of demodulating an incoming radio frequency (RF) signal comprising the steps of:
generating an in-phase RF signal having a frequency of RF and an out-of-phase signal having a frequency of RF from the incoming RF signal;
mixing in a first RF mixer the in-phase RF signal with an in-phase local oscillator (LO) signal having a frequency of LO, wherein LO is approximately equal to one-half of RF, to thereby generate a first intermediate frequency (IF) signal having a frequency of LO;
mixing in a second RF mixer the out-of-phase RF signal with an out-of-phase local oscillator (LO) signal having a frequency of LO, to thereby generate a second intermediate frequency (IF) signal having a frequency of LO; and
combining in a signal combiner the first and second IF signals to generate a composite IF signal, wherein the step of combining further combines a first leakage signal from the first RF mixer and a second leakage signal from the second RF mixer such that the first and second leakage signals at least partially cancel each other to produce an output leakage signal that is less than either of the first and second leakage signals.

20. The method as set forth in claim 19 further comprising the step of filtering the composite IF signal to isolate the desired frequencies around the frequency of LO.

21. The method as set forth in claim 20 further comprising the step of mixing in an IF mixer the filtered composite IF signal with reference local oscillator signal having a frequency of LO to thereby down-convert the filtered composite IF signal and generate a first baseband signal.

22. The method as set forth in claim 21 further comprising the step of combining the first baseband signal and a DC cancellation signal to thereby generate a second baseband signal.

* * * * *